United States Patent [19]

Lee et al.

[11] Patent Number: 4,888,735
[45] Date of Patent: Dec. 19, 1989

[54] ROM CELL AND ARRAY CONFIGURATION

[75] Inventors: Wung K. Lee, San Jose; Stephen S. Chiao, Saratoga, both of Calif.

[73] Assignee: Elite Semiconductor & Systems Int'l., Inc., San Jose, Calif.

[21] Appl. No.: 187,171

[22] Filed: Apr. 28, 1988

Related U.S. Application Data

[63] Continuation-in-part of Ser. No. 139,885, Dec. 30, 1987.

[51] Int. Cl.$^4$ .............................................. G11C 11/40
[52] U.S. Cl. ..................................... 365/185; 365/104
[58] Field of Search ................ 365/185, 104; 357/23.5

[56] References Cited

U.S. PATENT DOCUMENTS

| | | | |
|---|---|---|---|
| 4,328,565 | 5/1982 | Harari | 365/185 |
| 4,467,453 | 8/1984 | Chiu et al. | 365/185 |
| 4,639,893 | 1/1987 | Eitan | 365/185 |
| 4,783,766 | 11/1988 | Samachisa et al. | 365/185 |

OTHER PUBLICATIONS

G. Samachisa, "A 128K Flash EEPROM Using . . . ", IEEE Journal of Solid State Circuits, vol. SC-22, No. 5, Oct. 1987.

Primary Examiner—James W. Moffitt
Attorney, Agent, or Firm—Rosenblum, Parish & Bacigalupi

[57] ABSTRACT

An EPROM structure incorporating Vss isolation transistors having gates on wordlines shared by respective rows of conventional self-aligned EPROM cells, and having source and drain regions connected in series between EPROM cell source regions and the ground Vss terminal. An isolation transistor becomes conductive only when an EPROM cell sharing its wordline is selected. During programming, otherwise possible leakage current through unselected cells sharing the selected bitline is blocked by the Vss isolation transistor. Only one unselected adjacent cell, which shares a common source region with the selected cell, can leak. This leakage, if properly suppressed and compensated, has no disturbance on the unselected or selected cells during array programming. The EPROM cell drain punch-through voltage and channel length can thus be reduced to obtain ROM and EPROM cells with low threshold voltages, low drain programming voltages, short programming times, low cell junction and bitline capacitances, and high read currents. EPROM-type products can be constructed with single low power supplies, on-chip high voltage pumping and high speed read and programming. Additional rows of shared isolation transistors can be formed by adding extra poly(2) lines in parallel to the wordlines betwen EPROM source diffusions to achieve fuller programming isolation. This cell and array isolation configuration can be extended to flash EEPROM type products. The cell and array configuration of the present invention can also be embodied in ROM type products by omitting the poly(1) floating gates underneath the poly(2) worlines in ROM cells.

13 Claims, 12 Drawing Sheets

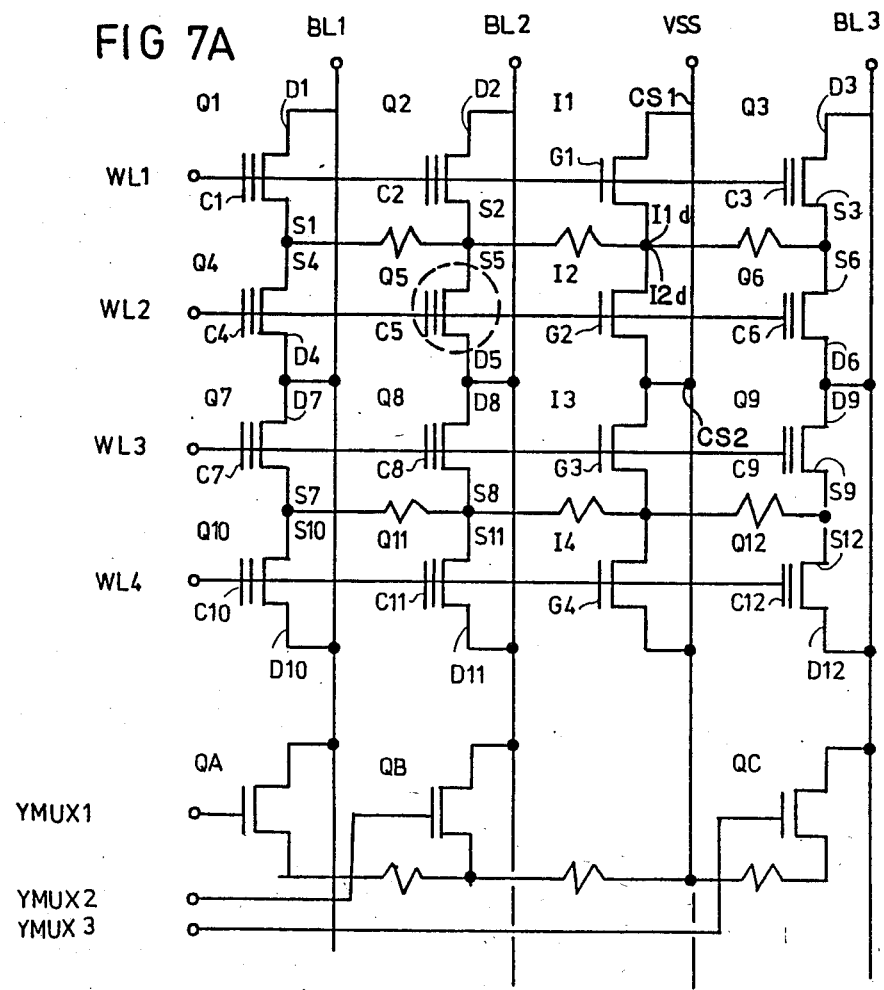
FIG 7A
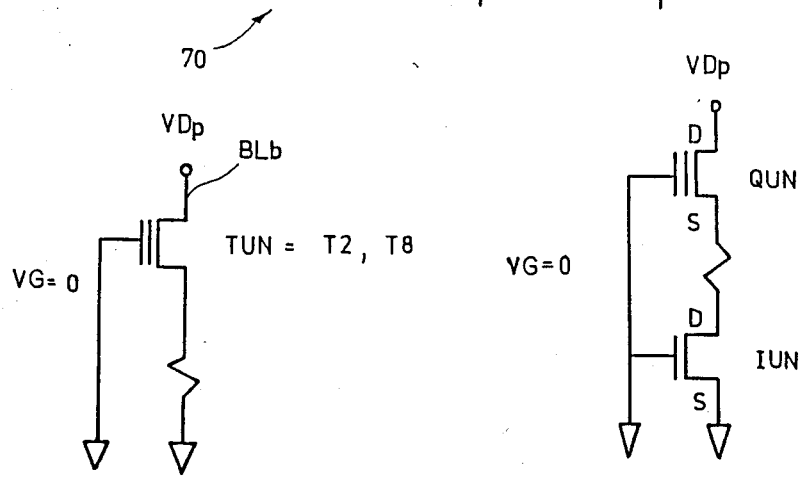
FIG 4
PRIOR ART
FIG 8

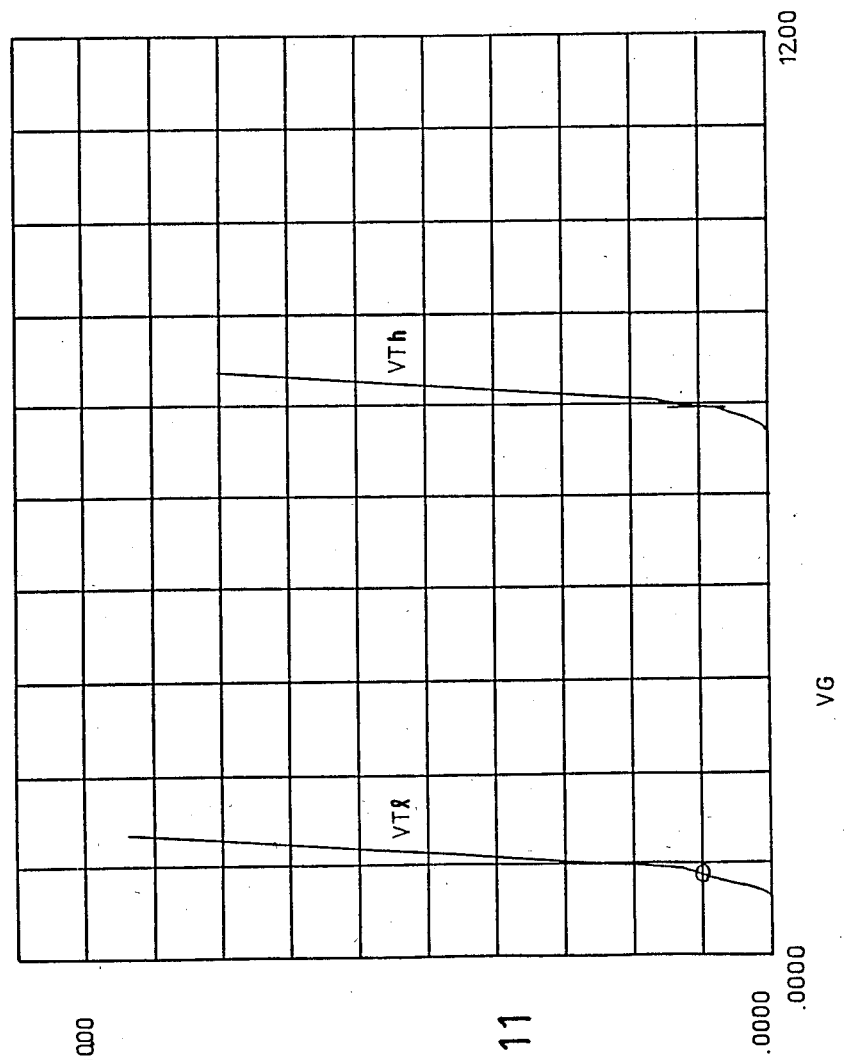

ROM CELL AND ARRAY CONFIGURATION

BACKGROUND OF THE INVENTION

1. Field of the Invention

This invention relates generally to mask ROM, non-volatile EPROM and flash EEPROM circuits, and more particularly to techniques of isolating unselected cells during programming and/or reading of selected cells in ROM, EPROM and flash EEPROM arrays.

2. Discussion of the Prior Art

This application is a continuation-in-part of application Ser. No. 139,885 filed Dec. 30, 1987 and assigned to the assignee of this application.

Referring to FIG. 1, a typical prior art erasable programmable read only memory (EPROM) 10 comprises an array of EPROM transistors or cells (of which for the sake of clarity only nine cells T1–T9 are shown) sharing drain regions D1–D9 which are connected to array bitlines BLa-BLc, sharing common source regions connected to a hardwire line Vss1 to ground, and having control gates C1–C9 which are shared as array wordlines WLa-WLc. FIG. 2 shows a prior art N-channel enhancement mode EPROM cell 20 in a cross-section across control gate 22. The shared second layer polycrystalline silicon (poly2) control gate 22 is stacked on top of oxide or nitride/oxide dielectric film 24, which lies over poly1 floating gate 26, which lies over thermally grown thin oxide layer 28 over channel 30 between N++ source region 32S and N++ drain region 34D in P-type silicon substrate 36.

The FIG. 1 prior art EPROM array 10 is typically laid out in rows and columns on substrate 36 as partially shown in FIG. 3. In columns Ca and Cb transistors T1, T4 and T2, T5 have their drain regions TD1, TD4 and TD2, TD5 connected through contacts TCD1, TCD4 and TCD2, TCD5, respectively, by metal bitlines (omitted for the sake of clarity) overlying insulation on poly2 wordlines WLa and WLb. Common source region Sa-b is connected through contact CS by a Vss hardwire metal line, also not shown, running over insulation, to a ground terminal. Poly2 control gate wordlines WLa and WLb run over dielectric film 24 over rows of poly1 floating gates TF1, TF2, and TF4, TF5 in columns Ca and Cb between the discrete drain regions and common source region Sa-b to form conventional fully self-aligned EPROM cells T1, T2, T4 and T5.

An EPROM cell 20 in the unprogrammed state (before programming or after erasure by ultra-violet light), has essentially no electron charge residing on floating gate 26, and the cell has a low switching voltage threshold Vtl requiring only about 1.5 volts on control gate 22 to establish conduction through channel 30. To program the cell to a state with a high switching voltage threshold Vth, a high (up to 8V) drain programming voltage Vdp is pulsed to drain 34d and a higher (up to 14V) control gate programming voltage Vcp is pulsed to control gate 22, while both the source 32S voltage Vs and the substrate 36 voltage Vbb are held at zero. The high drain programming voltage Vdp and control gate programming voltage Vcp bias EPROM transistor 20 into its saturation condition and control gate 22 is capacitively coupled to active channel region 30 to establish a strong vertical electrical field which exerts a high (8 to 10) voltage on floating gate 26. The vertical field generates many hot electrons in channel 30 at the pinch-off region close to the drain junction, some of which are attracted toward floating gate 26 with sufficient kinetic energy to surmount the Si-SiO2 interoxide barrier, penetrate floating gate oxide layer 28, become trapped inside floating gate 26 and raise the threshold voltage Vt to a programmed high (normally above 5 volts) level Vth.

Generally, EPROMS are programmed at a high drain voltage Vdp in order to generate maximum quantities of channel hot electrons. If a selected cell T5 (FIG. 1) is programmed by applying Vdp=8 volts to its drain D5 bitline BLb and applying Vcp=14 volts to its gate C5 wordline WLb, then, on the selected bitline BLb, the unselected cells T2 and T8 also receive 8 volts on their drains D2 and D8 while receiving zero volts on their control gates C2 and C8. FIG. 4 shows the equivalent circuit for the adjacent unselected cells Tun=T2 and T8 with drains on the selected bitline Blb. The high Vdp on bitline BLb shared by unselected cell drains D2 and D8 couples to their floating gates F2 and F8, slightly turning on unselected cells T2 and T8 to conduct leakage currents. This is a "grounded gate turn-on" or "grounded gate drain breakdown" (so-called BVDSS) condition. The lower the Breakdown Voltage between the Drain and the Source when the gate is Shorted to the source ("BVDSS"), the higher the leakage current. If a high density memory array 10 incorporates 1,000 wordlines and if at this high drain programming voltage Vdp on a selected bitline, each unselected cell has a 1 uA leakage current, the selected bitline has a 1 mA leakage current added to the programming current (about 0.5 mA–1.0 mA) for the selected cell. At worst, leakage currents can exceed 1 mA. High/low density EPROM memory cell's BVDSS vary cell by cell, chip by chip, and wafer by wafer. Therefore, conventional high/low density and high/regular speed nonvolatile EPROM cells require a BVDSS guardband for a margin of safety. Prior art EPROM cells using a drain programming voltage of Vdp=8 volts need a high drain breakdown voltage of around 10 to 11 volts to guarantee suitable unselected cell isolation and programmability. This drain breakdown voltage limitation makes it difficult to scale down the prior art EPROM cell channel length and implant concentration. Programming isolation is a major concern when a conventional EPROM cell channel length is scaled down to short channel regions (such as 1.0 um). This high BVDSS criteria in a conventional EPROM cell 20 requires increasing the doping concentration in channel region 30, which undesirably significantly reduces cell 20 current, increases the bitline junction capacitance, and limits the scale-down capability of the channel 30 length and of the cell 20 size. Thus, high density megabit EPROMs have been hard to produce at high yield rates with consistently optimized array programmability and high read/write speeds. Relieving the BVDSS guardband constraint could facilitate manufacturing EPROM arrays with more consistent programmability, smaller size, higher read access speed, and higher manufacturing yields.

Referring to FIG. 5, U.S. Pat. No. 4,328,565 to Harari teaches an EPROM cell 50 in which control gate 52,52' extends beyond the left edge 56L floating gate 56,56' and beyond underlying (first) channel portion 61 towards source region 62S to overlap substrate 66 and form a control gate (second) channel portion 62 extending from first channel portion 61 in series to source region 62S. Control gate 52,52' is less strongly capacitively coupled to drain 64D and does not invert the second channel portion 62 in an unselected cell when drain region 64D of that cell is subjected to a high Vdp during programming of an adjacent selected cell. The non-inverted second channel portion 62 blocks leakage current from flowing through first channel portion 61. The two channel portions 61 and 62 are manufactured simultaneously, and hence their combined total length 60 is constantly defined by a mask (not shown). However, each portion's separate length is inconstantly defined by the non-self-aligned gates 52,52' and 56,56', and these inconstant channel portion lengths 61 and 62 result in inconstant programmability and read current in Harari's cell.

FIG. 5 also shows how, in a partially self-aligned split gate EPROM as disclosed by Eitan in U.S. Pat. No. 4,639,893, the floating gate channel length 61 (which is more important than the total channel length 60) can be consistently defined by the poly1 floating gate 56 length (omitting floating gate portion 56') and by the drain 64D N++ ion implant which is self-aligned to the right edge 57 of poly1 floating gate 56. The control gate 52,52' (MOS) channel length 62 is not consistent but rather depends upon the alignment of the source 62S and drain 64D N++ ion implant mask (not shown) which is not perfectly aligned to poly1 gate 56. Therefore, in Eitan's cell the total channel length 60 is not constant, which compromises the cell 50 read current distribution. A too-short channel 60 can cause channel "punchthrough" conduction from drain 64D, when at high voltage, to source 62S. These non-alignment constraints do not allow making the control gate channel length 62 too short, and thereby limit scaling down the dimensions of such a prior art partially self-aligned split gate EPROM cell 50.

As shown in FIG. 6 Eitan exploits the constant floating gate channel length 61 to increase array density by using a virtual ground array structure in which, during programming cell T14, all unselected bitlines BLd, BLe and BLg and unselected wordlines WLd and WLf are clamped at the ground (zero volts) potential while high voltages are applied to selected wordline WLe and bitline BLf. Bitline BLf is shared (as the source) by adjacent unselected cell T15. In cell T15 hot electrons will be injected toward the control gate 52,52' and surface states may be generated at the source side 62S. A portion of these channel hot electrons reach and become trapped inside of the floating gate 56 of T15, to a degree dependent upon the electrical field between the T15 floating gate and the T15 channel surface beneath the left edge of its floating gate. Surface states and trapped electrons both increase the cell T15 threshold voltage Vt and compromise its reliability. Another problem of this prior art EPROM structure is that for each cell T10–T18 programming current is effectively doubled, which diminishes the attractiveness and practicality of multiple-byte programming.

FIG. 5 further shows how a prior art overlapping control gate cell can be modified as described by Samachisa et al. in an article entitled "A 128K Flash EEPROM Using Double-Polysilicon Technology" in the *IEEE Journal of Solid-State Circuits*, Vol. sc-22, No. 5, October 1987. The flash EEPROM array cells are all erased simultaneously by application of a high (19V) voltage on the drain 64D with the source 62S and gate 52 grounded. Unlike UV erasure, this usually over-erases the floating gate 56, leaving the floating gate with a positive charge so that the flash EEPROM is a (normally-on) depletion mode transistor ready to conduct leakage current when an adjacent cell (not shown) is selected for programming or reading. The cell's total channel length 60 is constantly defined by the poly2 mask (not shown) between control gate 52 left edge 51 and right edge 53. However, only the right edge 57 of poly1 floating gate 56 is self-aligned to edge 53 of poly2 control gate 52, so neither the floating gate channel length 61 nor the control gate channel length 62 is constant. This flash EEPROM cell has more drawbacks than the Eitan partially self-aligned cell because the flash EEPROM variable floating gate channel length 61 and resulting uncontrollable MOS punch-through voltage and read current cause programming inconsistency and limit scale-down of the cell.

Mask-programmed ROM devices are programmed during fabrication and are not subjected to high programming voltages which could cause the above-described unselected cell leakage currents. Nonetheless, ROM devices subjected to read voltages are liable to exhibit read operation leakage currents similar to EPROM read leakage currents.

Thus, there remains a need for shorter and more constant length channels in memory cells isolated from drain turn-on conditions in order to achieve high efficiency and consistent programming for EPROM products, and to achieve faster read speeds and scale-down ability without sacrificing performance for high or low density ROM, EPROM or flash EEPROM-type products.

SUMMARY OF THE PRESENT INVENTION

Briefly, preferred embodiments of the present invention provide ROM or EPROM arrays with means for isolating unselected non-adjacent cells during programming and/or reading by providing Vss Isolation transistors I shared by one or more conventional ROM transistors M or fully self-aligned stacked floating gate EPROM transistors Q on each array wordline, and thereby allow independent optimization for the ROM or EPROM cell read current (speed) and drain breakdown (turn-on) voltage BVDSS. In this invention, the ROM circuit embodiment with the addition of a floating gate is equivalent to the EPROM circuit embodiment. The ROM or EPROM cells' common source N++ diffusion functions as the drain of the Vss isolation transistor. The size of the isolation transistors can be independently optimized for programming and reading. The isolation transistors allow scaling down ROM or EPROM cells for both high speed and high/low density applications. In this invention, EPROM cell channels are fully self-aligned and thus have a constant length, resulting in a tight distribution of cell read current and access speed. Very short and constant length channel EPROM cells can be implemented with greatly enhanced programming efficiency and reading speed. Because the ROM or EPROM transistors and Vss isolation transistors are defined by the same (poly2) control gate, they track each other closely for read current, drain breakdown voltage, threshold voltage, and other characteristics. Another significant advantage is that unselected cell isolation is insensitive to process variations which in the prior art would otherwise be the major cause for yield losses. The short channel length also enables programming EPROM cells with a drain voltage Vdp as low as only 5 to 6 volts. With an on-chip high voltage pump for the control gate programming voltage Vcp, high/low read speed and high/low density EPROM related products can be realized with a single TTL power supply of only 5 to 6 volts.

For flash EEPROM (as well as EPROM) applications, to separate the commonly shared source diffusion regions of adjacent unselected cells, an extra isolation transistor can be employed by running an extra poly2 line in the center, and on top of, the split-common source diffusion, in parallel to the wordlines, to form an extra N-channel enhancement mode isolation transistor. In either EPROMs or flash EEPROMs with this poly2 layer tied to the ground potential during programming, and for EEPROMs during reading, any leakage current from possibly over-erased adjacent cells will be effectively blocked by the extra isolation transistor in conjunction with the Vss isolation transistor. If a flash EEPROM cell can be designed to avoid over-erasures (to negative threshold voltages Vtl), then this extra poly2 enhancement mode N-channel isolation transistor can be dispensed with, and the flash EEPROM array layout and read characteristics will be the same as those of the EPROM array. Thus, the invention is suitable for implementing both low or very high density and low or high speed ROM, EPROM and flash EEPROM products.

These and other objects of the present invention will become apparent to those of ordinary skill in the art upon reading the following detailed description of the preferred embodiments as illustrated in the accompanying drawing figures.

BRIEF DESCRIPTION OF THE DRAWING

FIG. 4 shows the equivalent circuit of an unselected nonadjacent cell on a selected bitline;

FIG. 7a is a schematic diagram of a fully self-aligned EPROM cell array embodying isolation transistors and Y-multiplexers according to this invention;

FIG. 8 shows the equivalent circuit of unselected non-adjacent cells having drains sharing the selected cell bitline in the invention;

FIG. 11 illustrates the threshold voltage Vt characteristics before and after programming of an example EPROM cell;

DETAILED DESCRIPTION OF THE PREFERRED EMBODIMENTS

FIG. 7a is a schematic diagram of an EPROM array 70 comprising fully self-aligned (floating gate) EPROM cells or transistors Q1 through Q12, array wordlines WL1 through WL4 connected to control gates C1–C12 of EPROM cells in respective rows, array bitlines BL1 through BL3 connected to drains D1–D12 of EPROM cells in respective columns, hardwire line Vss to a ground terminal, and, in accordance with this invention, Vss isolation transistors I1–I4, preferably enhancement mode N-channel MOS devices having gates G1–G4 formed by respective poly2 wordlines WL1–WL4, and each having a source and a drain connected in series between the sources of the EPROM transistors Q connected to the same wordline WL and the Vss ground terminal.

To program a selected cell Q5, the selected cell bitline BL2 potential Vd is raised to approximately Vdp=5 to 6 volts and the selected cell wordline WL2 potential Vc is raised to a maximum of Vcp=13 to 15 volts. The high gate programming voltage Vcp=13 to 15 volts (or reading voltage Vcr=Vcc-Vt or Vcc) on selected wordline WL2 rapidly turns on isolation transistor I2. The high gate programming voltage Vcp gives the isolation transistors a high transconductance and allows making them very small. The isolation transistor channel length and width can be designed to independently optimize the transconductance Gm, and drain breakdown voltage BVDSS, without sacrificing conventional EPROM cell 20 performance. Y-mux lines YMUX-1 and YMUX-3 turn on respective pull-down transistors QA and QC to clamp nonselected bitlines BL1 and BL3 to ground, and any leakage current through selected wordline WL2 unselected transistors Q4 and Q6 assists the turned-on isolation transistor I2 to ensure that the selected cell Q5 source region S5 remains close to the ground potential, which makes programming consistent for each cell in the array 70. During programming of selected cell Q5, the unselected wordline WL1, WL3 and WL4 potentials are clamped through X-decoder N-channel pull-up devices (not shown) to the ground potential.

Figure 1:
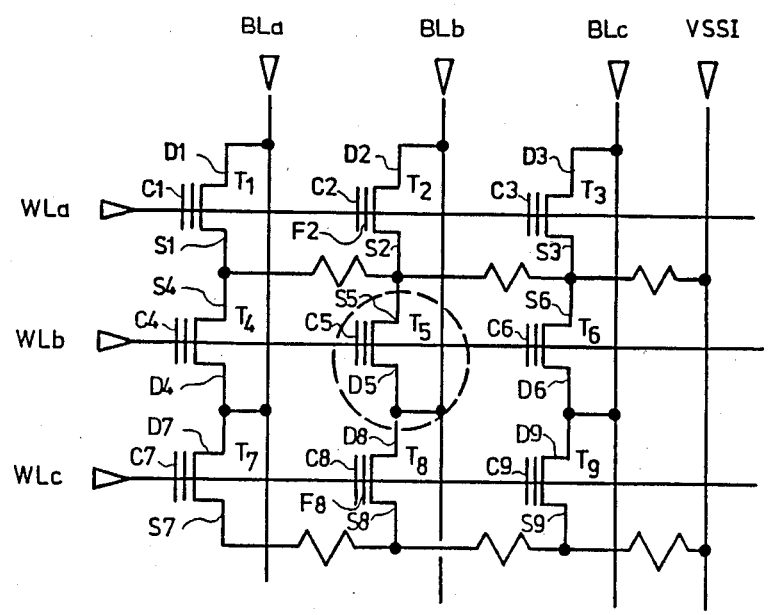
FIG. 1 illustrates a prior art EPROM cell array with shared drain diffusions for bitlines and with shared source diffusions hardwired by a Vss line to ground.
Figure 9:
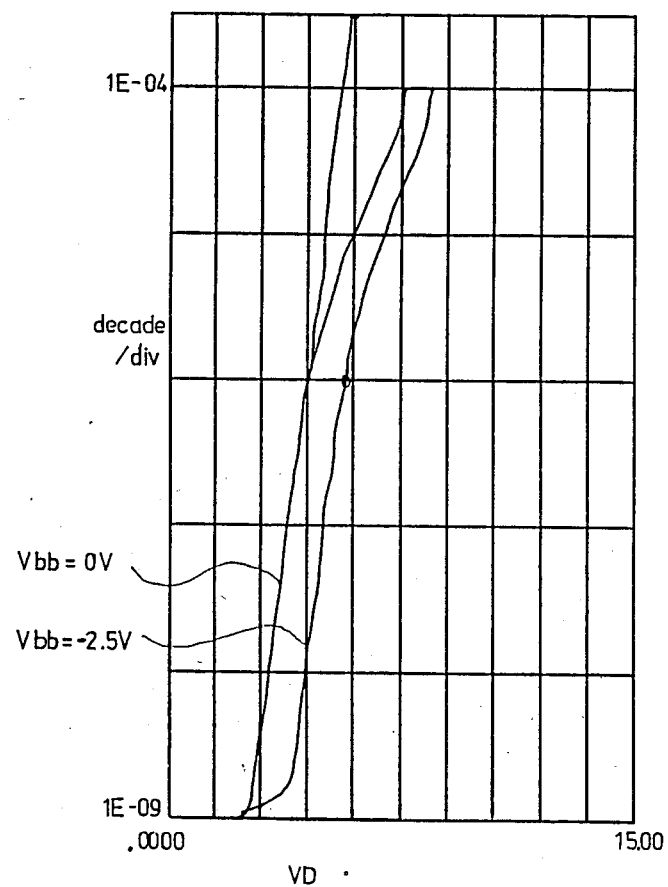
FIG. 9 shows for the present invention the drain breakdown (turn-on) characteristic of an unselected adjacent cell with a drain sharing the selected bitline and a source sharing the line connected through the turned-on isolation transistors to ground.

FIG. 8 shows for the invention the equivalent circuit of an unselected nonadjacent source cell Qun=Q8 or Q11 on the selected bitline BL2, for comparison with the FIG. 1 prior art equivalent circuit shown in FIG. 4. In the invention, any leakage (punch-through) current from an unselected nonadjacent cell Qun is blocked by Vss isolation transistor Iun, as long as Iun stays turned-off to float the source node of Qun. The only cell disturbed during programming of cell Q5 is unselected adjacent source cell Q2 which shares with the selected cell Q5 source N++ diffusion region S2=S5 which is connected through turned-on isolation transistor I2 to the Vss ground line. FIG. 9 shows the disturbed adjacent cell drain turn-on characteristic curve. The table below shows that repeated disturbances do not change an adjacent unselected disturbed cell's switching voltage threshold Vtl or drain turn-on breakdown voltage BVDSS:

|  | V + t | BVDSS |
| --- | --- | --- |
| After UV erase | 0.8 V | 3.6 V |
| 1 pulse (6 V @ 1 ms) | 0.8 V | 3.6 V |
| 1000 pulses (6 V @ 1ms) | 0.8 V | 3.6 V |

In practice, only unprogrammed (or erased) cells can be disturbed, and they will only be disturbed once per programming of the EPROM array, because the source-sharing adjacent cell will at most be programmed only once per programming of the array. Once programmed, a cell's BVDSS is typically 3 volts higher and the cell will not be stressed if its source-sharing neighbor is programmed afterwards. In contrast, in the prior art, the number of stressings on each cell is proportional to the number of cells on the same bitline, which can be up to 1,000 cells. Adjacent unselected EPROM cell leakage current can be compensated for by supplying more current to the selected bitline during programming.

Leakage current blocking by the isolation transistors relieves the EPROM cell BVDSS guardband constraint and allows reducing the minimum BVDSS, which in turn allows shortening the EPROM channel. EPROM arrays can be fabricated with short constant length channels of around 1.0 um for EPROM transistors and constant length channels of around 1.0 um to 1.2 um for Vss isolation transistors. Small variations in channel length do not significantly affect the drain breakdown voltages of unselected cells on the selected cell bitline because the Vss isolation transistor blocks leakage current. This improves the manufacturing yield rate. The drain breakdown voltage BVDSS of unselected and selected EPROM cells can even be lower than the drain programming voltage Vdp, as long as any leakage current is compensated for by using a stronger pull-up device in the data input buffer (not shown). Channel length shortening allows scaling down cell size for megabit ROMS and EPROMs, which reduces the cell junction capacitance, improves EPROM programming efficiency, increases the ROM or EPROM cell read current, and raises product manufacturing yield rates.

Figure 10:
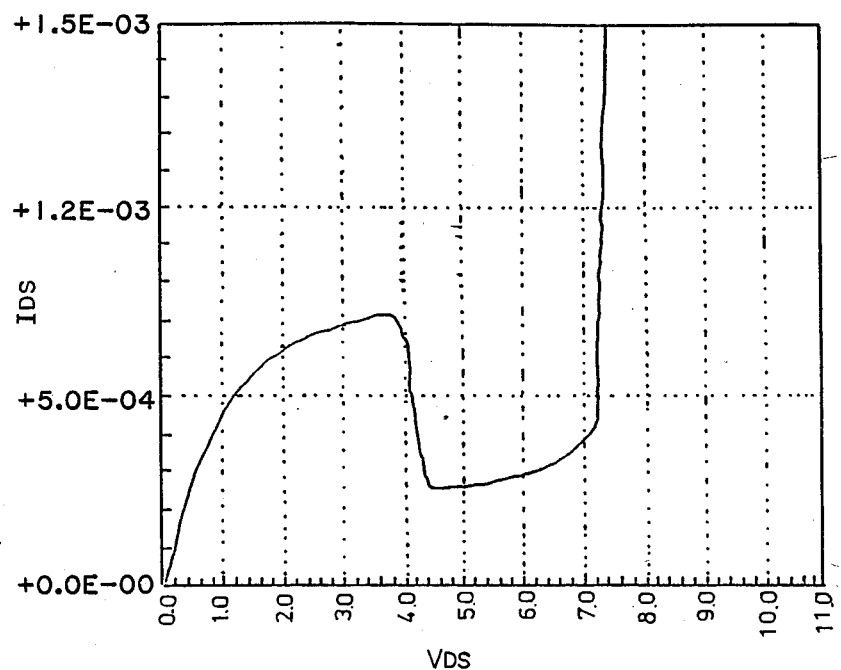
FIG. 10 illustrates a one shot programming Ids-Vds curve for an EPROM cell with an Leff=1.0 micron according to this invention.

FIG. 10 shows the one-shot Ids-Vds curve with Vgs=15 volts for a 1um length channel EPROM cell. This EPROM cell can be programmed with Vds=6.0 volts. The high programming voltage Vcp applied to the control gate draws very little current and can be rapidly charged-pumped from a 5 or 6 volt power supply. Experimental results show that a BVDSS=3 to 4 volts is satisfactory for a programming Vdp=5 to 6 volts. Since according to the present invention the drain programming voltage Vdp is as low as the regular TTL power supply, there is no need for a high voltage power supply (Vpp). Therefore, in EPROM related products, Vpp can be omitted or used for test modes or for other control logic to enhance the production yield. This invention thus enables designing EPROM type products which require only a single 5 or 6 volt low power supply and which therefore can be "in the field." FIG. 11 shows the Vtl before and the Vth after a 0.1 msec fast programming pulse. A Vth of more than 7 to 8 volts can be obtained easily. Whereas the conventional EPROM cell Vtl ranges from 1.5 to 2 volts in order to obtain a high drain breakdown voltage, according to this invention the cell Vtl can be as low as 0.8 to 1.0 volts, which allows low bitline diffusion capacitance, high read current, and fast access speed. The low cell Vtl eliminates the need for implanting a high dose of Boron and eliminates a need for an implant mask to block the high dosage from being implanted into periphery transistors, which simplifies the conventional EPROM fabrication process, reduces manufacturing costs and improves throughput. Since the EPROM cell drain breakdown voltage is no longer a major concern, the source/drain oxidation after source/drain implanting can be longer to increase the floating gate overlap over the drain N++ diffusion and thereby further increase programming efficiency and manufacturing yield rates.

Figure 7B:
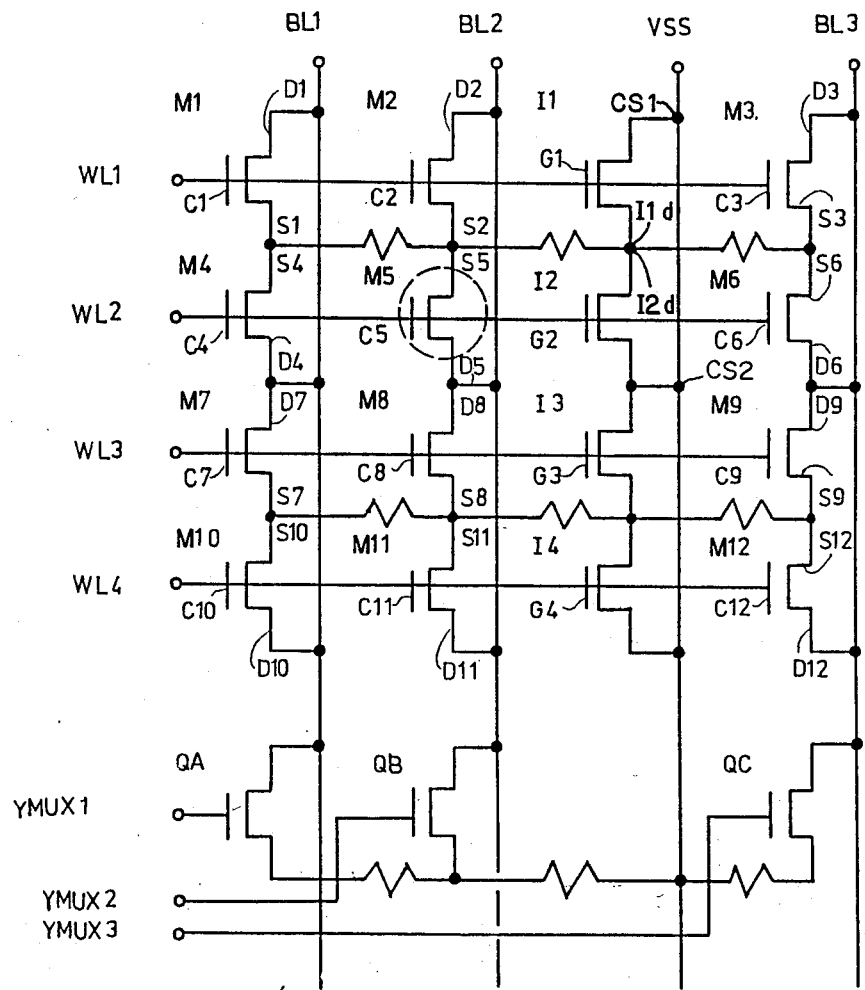
FIG. 7b is a schematic diagram of a ROM cell array corresponding to the FIG. 7a EPROM cell array without floating gates.

FIG. 7b is a schematic diagram of a ROM array 80 comprising self-aligned ROM cells or transistors M1 through M12, array word-lines WL1 through WL4 connected to gates C1-C12 of ROM cells in respective rows, array bitlines BL1 through BL3 connected to drains D1-D12 of ROM cells in respective columns, hardwire line Vss to a ground terminal, and, in accordance with this invention, Vss isolation transistors I1-I4, preferably enhancement mode N-channel MOS devices having gates G1-G4 formed by respective poly(2) wordlines WL1-WL4, and each having a source and a drain connected in series between the sources of the ROM transistors M connected to the same wordline WL and the Vss ground terminal.

Figure 3:
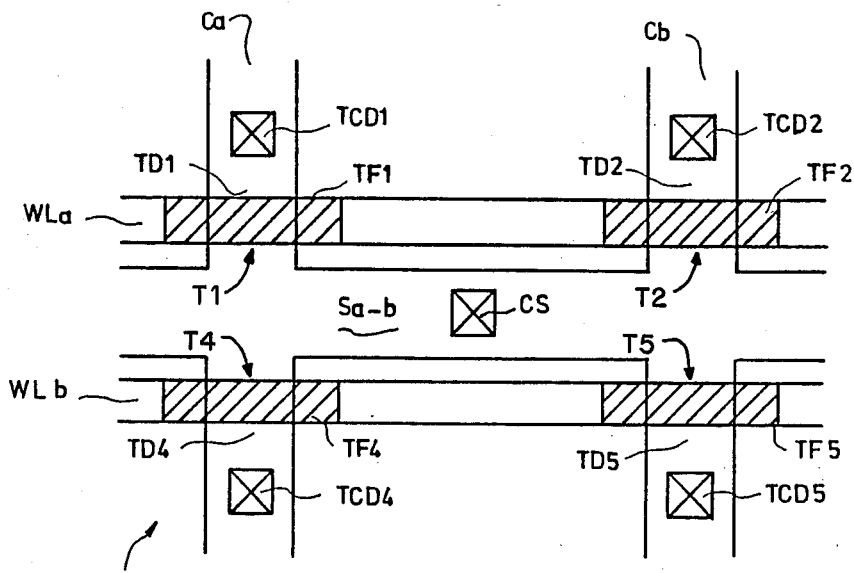
FIG. 3 shows a prior art EPROM cell layout in which a shared source diffusion region is hardwired by line Vss to ground.
Figure 12:
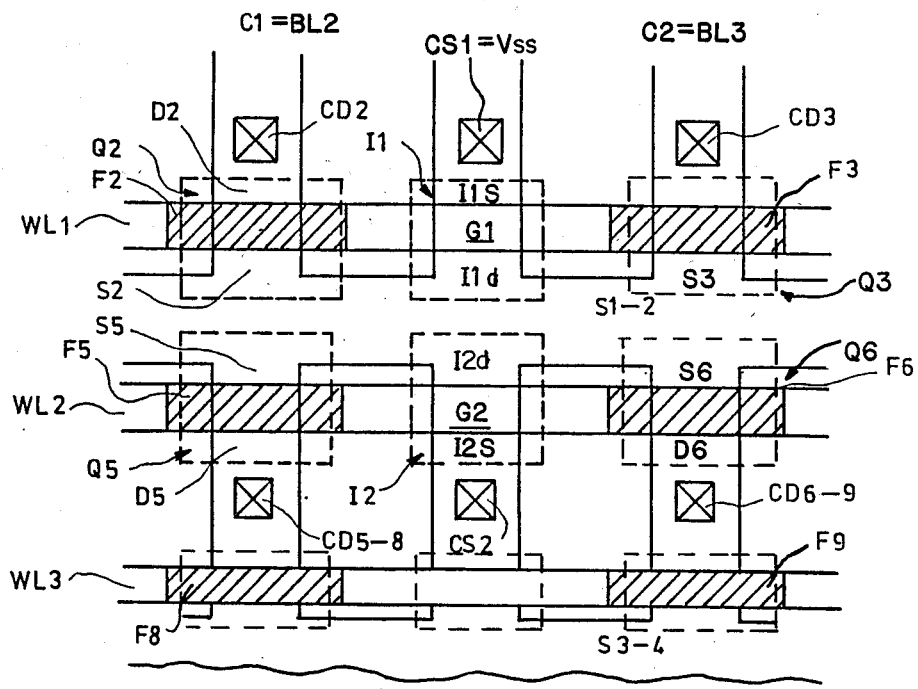
FIG. 12 shows the present invention in a cell layout in which the shared source diffusion region extends up and down and is self-aligned to two adjacent wordlines over the channels of two Vss isolation transistors, and in which Vss diffusion contacts are located on the sides of the gate wordlines opposite the EPROM shared source diffusion region.

This invention is preferably implemented using well known technologies for fabricating ROM or EPROM products. According to one embodiment of the invention, isolation transistors are formed in EPROM arrays laid out generally as shown in FIG. 12, for comparison with the prior art EPROM array layout of FIG. 3. ROM arrays are also laid out as shown in FIG. 12, except without floating gates F2, F3, F5, F6, F8 and F9. In FIG. 12, drain regions in each column C1, C2 are connected through contacts CD2, CD5-8, and CD3, CD6-9, respectively, by metal lines (not shown) lying on insulation over poly2 wordlines WL1, WL2 and WL3. The addition of the Vss isolation transistors I1, I2 does not necessarily increase the EPROM array die size over prior art EPROM array die sizes because the FIG. 3 prior art Vss diffusion Sa-b contact CS "real estate" can be used to form FIG. 12 Vss isolation transistors I1, I2, etc. In the invention, source N+ diffusion region S1-2 has no direct contact but is extended vertically and self-aligned to edges of poly2 wordlines WLI, WL2, etc. to provide drain regions for isolation transistors I1, I2, etc. The vertically opposite sides of poly2 wordlines WL1 and WL2 are provided with respective isolation transistor source regions and further provided with contacts CS1, CS2, etc. Isolation transistors I1, I2, etc. have no poly1 floating gate under their poly2 wordline, which is effectively lowered over the channels of the isolation transistors to increase the current gain.

Figure 13:
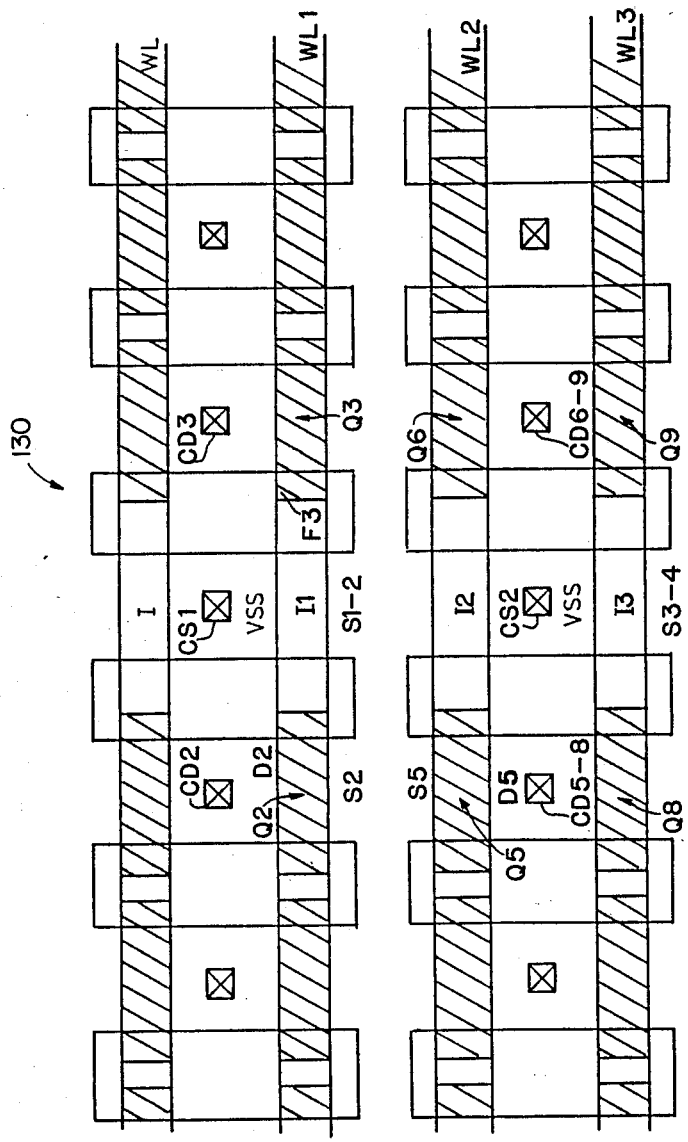
FIG. 13 illustrates the invention in an embodiment of an EPROM array wherein a plurality of cells share each isolation transistor.
Figure 14:
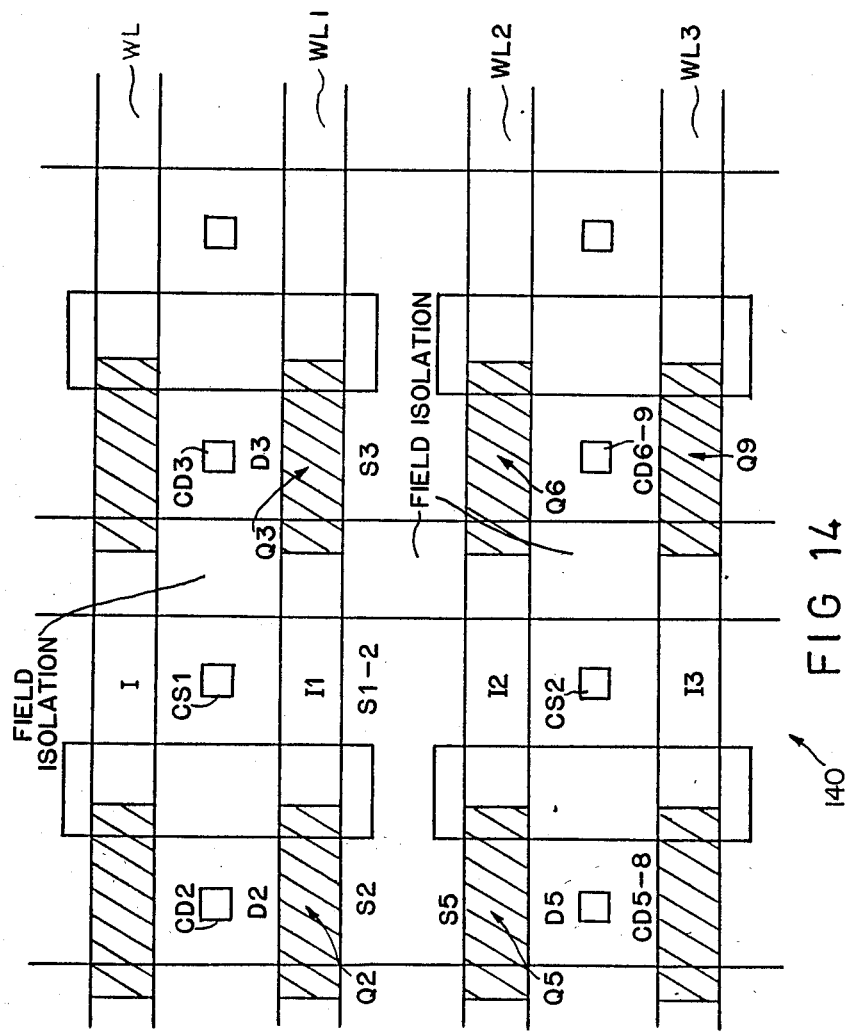
FIG. 14 illustrates an embodiment in high-speed PAL ® type EPROM array products wherein each cell has one dedicated isolation transistor.

On each wordline WL, the number of EPROM transistors Q which can share a given Vss isolation transistor I depends upon the intended application and speed of the EPROM device. For high density EPROM products 130 as shown in FIG. 13, approximately 8 to 16 EPROM cells Q may share each Vss isolation transistor I. Low density EPROM (PAL ®) product 140 speed can be improved by providing each EPROM cell with a respective Vss isolation transistor as shown FIG. 14.

Figure 5:
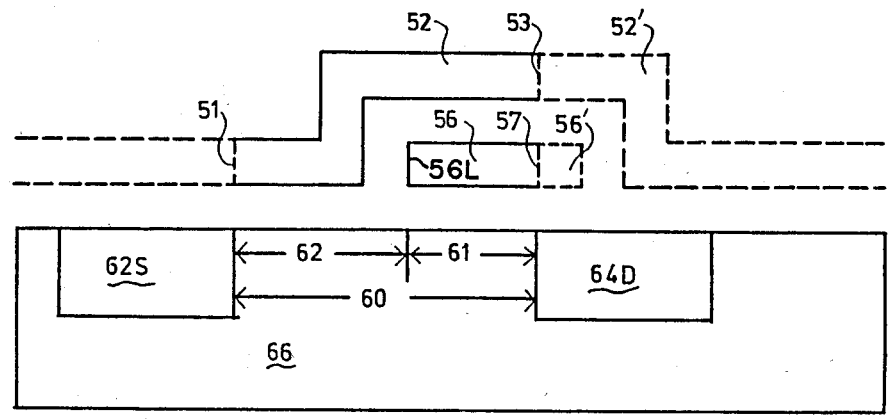
FIG. 5 illustrates three prior art overlapping control gate EPROM or flash EEPROM cells with a channel having a first portion under the floating gate and a second portion under the overlapping control gate.
Figure 6:
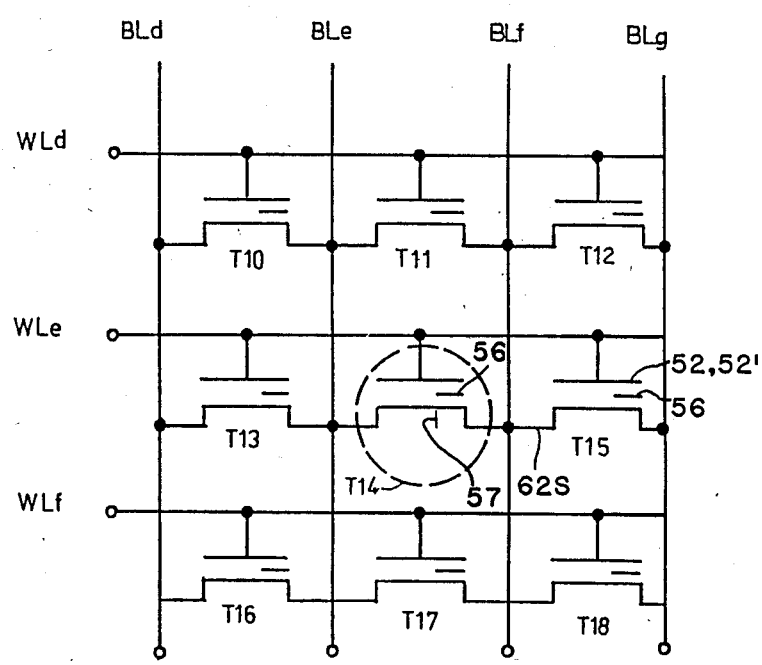
FIG. 6 illustrates the FIG. 5 prior art split gate EPROM used in an array with virtual ground lines.
Figure 15:
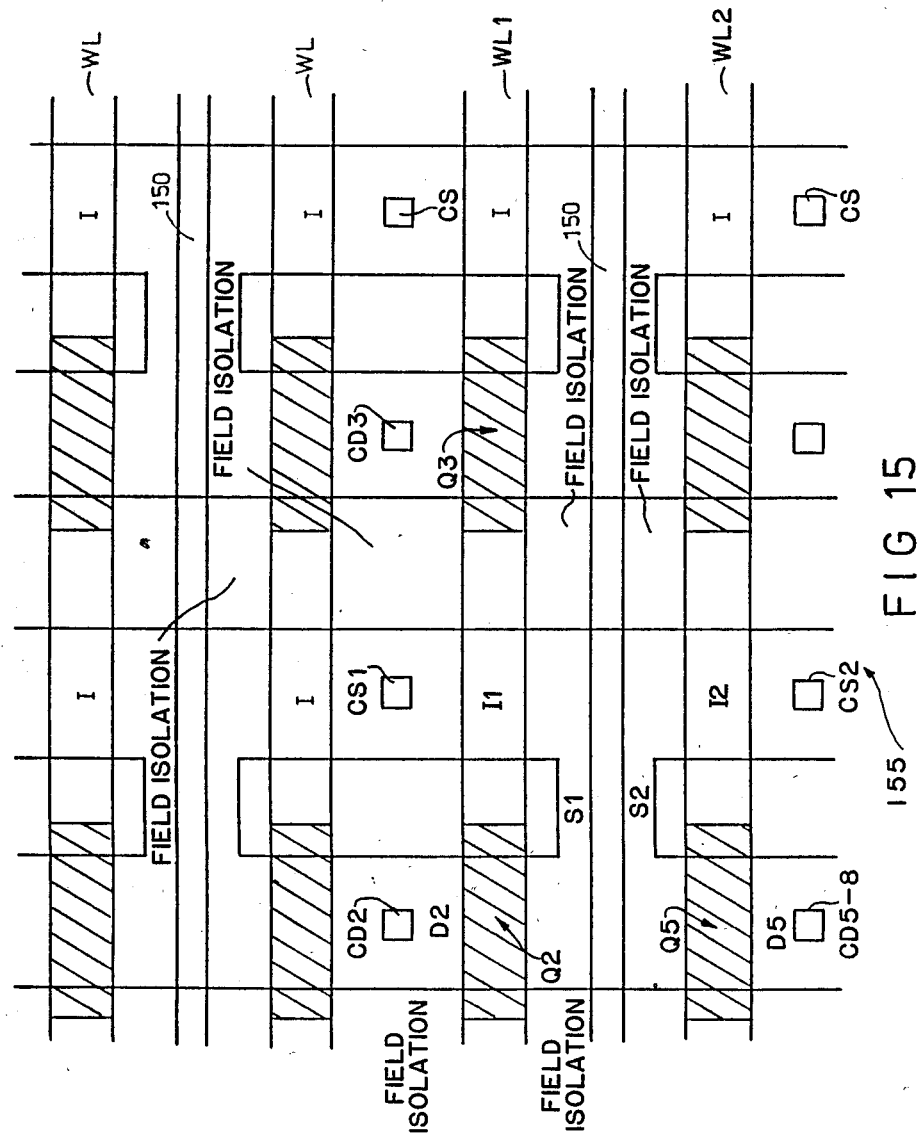
FIG. 15 illustrates the invention in an alternate embodiment in high-speed PAL ® type Flash EEPROM products.
Figure 16:
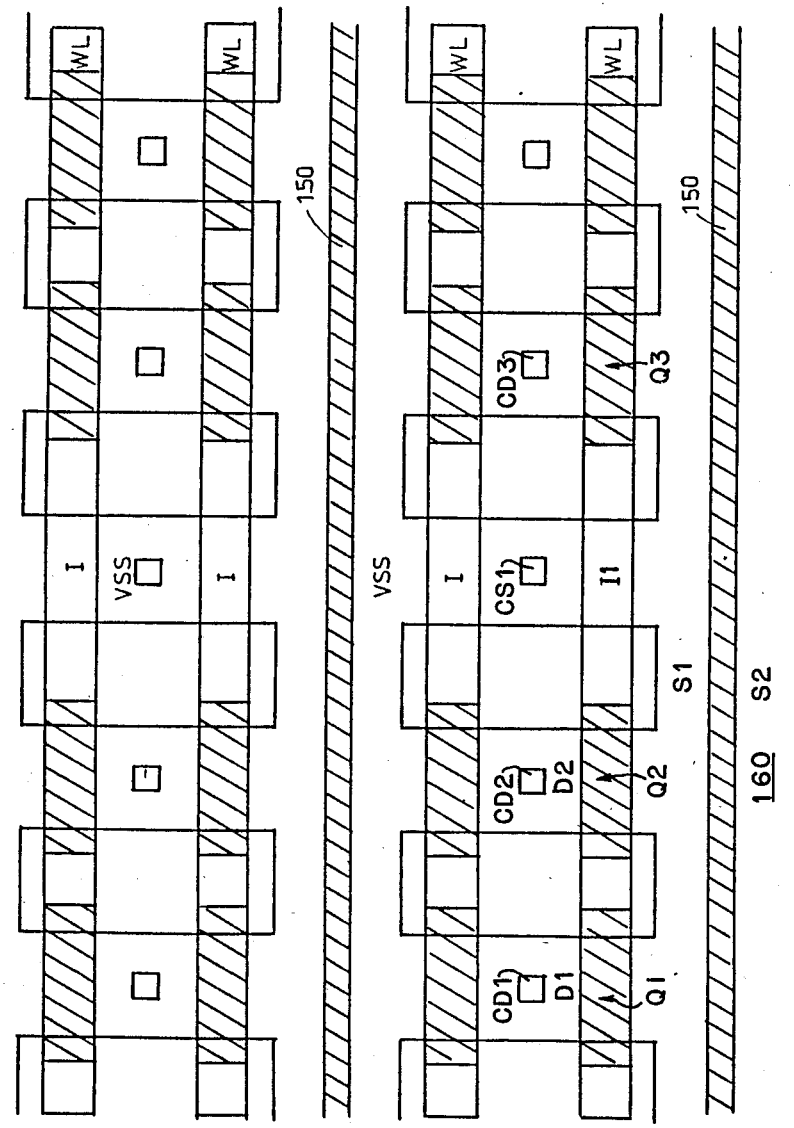
FIG. 16 illustrates the invention in an embodiment as a full isolation EPROM or flash EEPROM array including an extra poly2 line parallel to, and in the center of, the cell's common source diffusion region.

FIGS. 15 and 16 show how this invention can be embodied in flash EEPROM structures 155 and 160, respectively, by adding long poly2 lines 150 parallel to the wordlines WL and in the middle of split common source diffusions to form an additional poly2 isolation transistor with a minimum channel length, because the separation between its source and drain regions is relatively small. To achieve full isolation of adjacent cells during programming and reading, each extra poly2 line 150 is held at the ground potential, and will block leakage current from a possibly over-erased (negative Vtl) cell adjacent the selected cell on the same bitline. During reading operations, the extra poly2 line 150 can be biased to Vcc to electrically remove this isolation to achieve low common source resistance for higher speed reading if the cell Vt is positive. The majority of drain current during electrical flash erasure will thus result from Fowler-Nordheim tunneling, which is very small for single cells. The required high voltage on the drain during erasure can be charge-pumped from Vcc, permitting realization of a single power supply flash EEPROM. This new flash EEPROM cell can be combined with the new Vss isolation transistor to achieve very high density products. This increases flash EEPROM cell size by about 10% to 15%, but not to the size of the FIG. 5 prior art flash EEPROM cell. Field isolation by adequate spacing between source N++ diffusions can be employed instead of the extra poly2 isolation transistor, but would increase the array size. If flash electrical erase can be controlled to avoid over-erasures, this extra poly2 line can be eliminated to yield EPROM and flash EEPROMs with essentially equivalent structures, although in practice flash EEPROM arrays differ slightly from EPROM arrays. The extra poly2 line 150 can be used in an EPROM array to achieve full isolation during programming. The cell programming efficiency is not degraded because a constant length short channel can be used.

Figure 2:
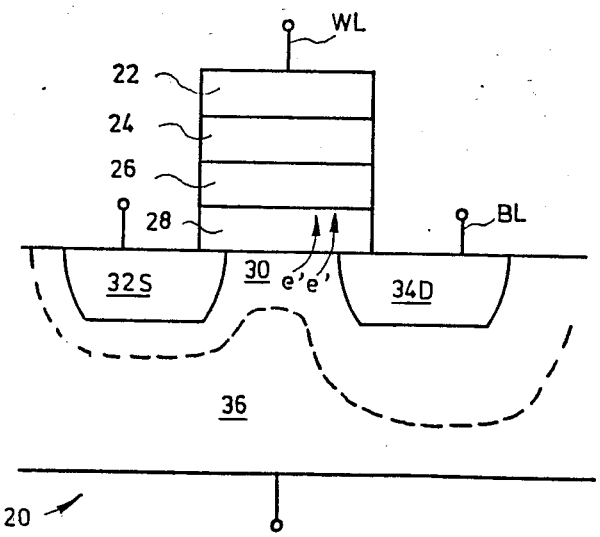
FIG. 2 illustrates a prior art fully self-aligned EPROM cell wherein the channel ends are both self-aligned to the edges of the floating gate and of the control gate to obtain a constant length channel.
Figure 17:
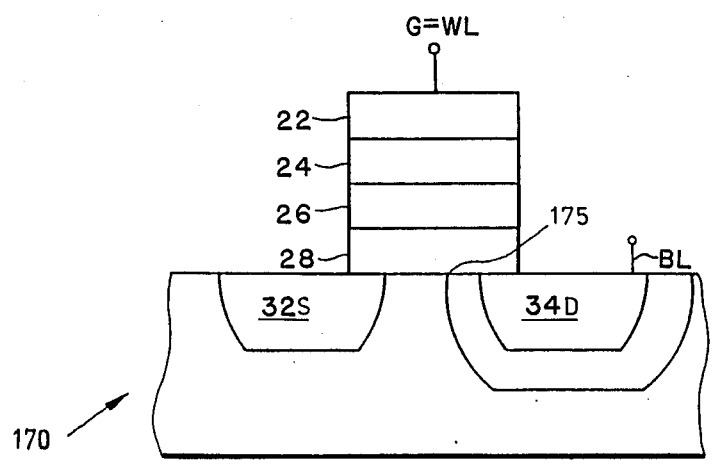
FIG. 17 shows the invention embodied in a flash EEPROM cell employing a double diffused drain junction to reduce the drain leakage current during erasure.

FIG. 17 shows a cross-section through a flash EEPROM cell 170 which may be used in arrays according to this invention. This cell is similar to the FIG. 2 conventional self-aligned EPROM cell except that it incorporates a double-diffused drain region to increase the drain breakdown voltage during erasure. The double diffused drain decreases leakage current at the drain junction 175 and drain surface beneath the floating gate.

Although the present invention has been described above in terms of several preferred embodiments, it will be appreciated by those skilled in the art that additional alterations and modifications thereof may be made without departing from the essence of the invention. It is therefore intended that the appended claims be interpreted as covering all such alterations and modifications as fall within the true spirit and scope of the invention.

What is claimed:

1. A ROM structure comprising:
a plurality of ROM cells, each including a transistor having a gate electrode with opposite sidewalls, a channel ending in junctions self-aligned under respective ones of said sidewalls, a source region and a drain region extending from opposite end junctions of said channel, said ROM transistors being arranged in rows and columns as an array, ROM transistors within each said row having their gate electrodes inter-connected by a respective wordline to the gate electrodes of the ROM transistors in the other columns of its row and ROM transistors within each said column having their drain regions inter-connected by a respective bitline to the drain regions of the ROM transistors in the other rows of that column, characterized in that said structure further includes in each row at least the MOS isolation transistor which has a gate electrode connected to the wordline in that row, has a drain region connected to the source regions of the ROM transistors in that row, and has a source region connected to a ground potential terminal, whereby a reading potential applied to a selected wordline causes an isolation transistor which has its gate electrode connected thereto to conduct current from the ROM transistor source regions connected to the drain region of said isolation transistor through said isolation transistor and hence to said ground potential terminal.

2. A structure as in claim 1 wherein
said ROM and isolation transistors are formed from a semiconductor substrate,
each said wordline is a straight conductor, and is parallel to, and separated by a predetermined space from, wordlines in adjacent rows,
said ROM transistor drain regions and said isolation transistor source regions are discrete regions formed in said substrate in respective columns in first alternate spaces between said wordlines, and
said ROM transistor source regions and said isolation transistor drain regions are common regions formed in said substrate in second alternate spaces between said wordlines.

3. A structure as in claim 1 wherein said ROM transistors are ultraviolet light erasable EPROM transistors, said gate electrodes are control gate electrodes, and each said EPROM transistor further comprises a floating gate electrode.

4. A structure as in claim 3 wherein said EPROM transistors comprise flash EEPROM transistors, additional isolation transistors are formed by extra poly2 lines formed between EEPROM transistor common source regions in the middle of said second alternate spaces between adjacent rows of EEPROM cells, and are adapted to be either biased to the ground potential to better isolate unselected flash EEPROM transistors during selected EEPROM transistor programming, or to be biased to VCC to reduce Vss series resistance during selected EEPROM transistor reading, or to be biased to the ground potential to block possible leakage current from un-selected over-erased flash EEPROM transistors during selected EEPROM transistor reading.

5. A structure as in claim 4 wherein each said EEPROM transistor drain region is double-diffused for increased drain break-down voltage and decreased drain leakage current during electrical flash erasure, and wherein each said channel has a short length for more efficient programming.

6. An EPROM structure as in claim 3 wherein said EPROM transistor source regions and said isolation transistor drain regions are formed in said substrate spanning multiple columns in said second alternate spaces.

7. An EPROM structure as in claim 3 wherein said EPROM transistors have a BVDSS below the EPROM transistor drain programming voltage while EPROM transistors having their gate electrode connected to a non-selected wordline, their drain region connected to the selected bitline, and their source region not connected to the source region of a selected transistor do not conduct BVDSS leakage current.

8. An EPROM structure as recited in claim 7 formed from a semiconductor substrate wherein said channel has its conductivity adjusted to a low switching threshold by a blanket-implanted light dosage of boron without using an ion implantation mask to shield whatever other devices are generally formed around the periphery of said array in a substrate with said EPROM transistors.

9. An EPROM structure as in claim 7 wherein each said EPROM transistor is programmed by the application of about 6 volts to the drain region and concurrent application of a maximum of about 14 volts to the control gate electrode of said EPROM transistor.

10. An EPROM structure as in claim 9 wherein each said EPROM transistor is programmed by the application initially of a maximum of about 14 volts to said control gate electrode followed by the application supplementarily of about 6 volts to said drain region of said EPROM transistor.

11. An EPROM structure as in claim 10 further comprising charge pump means for providing the gate programming voltage from a low voltage supply used for the drain programming voltage Vcc.

12. An EPROM structure as in claim 10 wherein said EPROM transistors are selectively programmable by applying a programming voltage on the bitline to the drain region of the selected transistor while the source region of said selected transistor is connected through multiple paths in parallel to said ground potential terminal.

13. An EPROM structure as in claim 12 comprising in each column a YMUX transistor having a source region and a drain region coupled between the respective bitline and said ground potential terminal, for connecting unselected bitlines in parallel to said ground terminal during programming or reading.

* * * * *